Dec. 30, 1969 A. MATZELLE ET AL 3,487,338

THREE TERMINAL SEMICONDUCTOR DEVICE FOR CONVERTING AMPLITUDE MODULATED SIGNALS INTO FREQUENCY MODULATED SIGNALS

Filed Sept. 21, 1966 3 Sheets-Sheet 1

Inventors:
ARTHUR E. HAHN, JR &
ARNOLD MATZELLE
By Arthur J. Spechler
Attorney

Dec. 30, 1969 A. MATZELLE ET AL 3,487,338
THREE TERMINAL SEMICONDUCTOR DEVICE FOR CONVERTING
AMPLITUDE MODULATED SIGNALS INTO
FREQUENCY MODULATED SIGNALS
Filed Sept. 21, 1966 3 Sheets-Sheet 2

Inventors:
ARTHUR E. HAHN, JR. &
ARNOLD MATZELLE
By Arthur I. Spechler
Attorney

Inventors:
ARTHUR E. HAHN, JR. &
ARNOLD MATZELLE
By Arthur I. Speckler
Attorney

United States Patent Office 3,487,338
Patented Dec. 30, 1969

3,487,338

THREE TERMINAL SEMICONDUCTOR DEVICE FOR CONVERTING AMPLITUDE MODULATED SIGNALS INTO FREQUENCY MODULATED SIGNALS

Arnold Matzelle, Brooklyn, N.Y., and Arthur Edward Hahn, Jr., Monmouth, N.J., assignors to RCA Corporation, a corporation of Delaware Filed Sept. 21, 1966, Ser. No. 580,935
Int. Cl. H03c 1/36
U.S. Cl. 332—31 9 Claims

ABSTRACT OF THE DISCLOSURE

The novel circuit element comprises a body of semiconductor material having contiguous N type and P type regions with a PN junction between them. The N type region has a bulk negative resistance characteristic and exhibits oscillations over a range of predetermined values of voltage applied between two closely spaced contacts on the N type region. The frequency of these oscillations can be controlled by a control voltage applied between a contact on the P type region and one of the contacts on the N type region.

This invention relates generally to semiconductor devices, and particularly to a novel semiconductor circuit element and means, in combination with the novel circuit element, to produce frequency modulated and/or amplitude modulated oscillations. The novel circuit element is particularly useful, in a relatively simple circuit, for converting amplitude modulated signals into frequency modulated oscillations.

It has been proposed to produce relatively high frequency oscillations, in the order of about 2 gHz. by applying an electric field of a threshold value (about 2000 v./cm.) across a homogeneous body of N type gallium arsenide. The high frequency oscillations generated in this manner cannot, however, be easily controlled, the prior-art gallium arsenide device being only a two-terminal device.

It is an object of the present invention to provide a novel semiconductor circuit element that can be utilized to generate high frequency oscillations which can be modulated easily in amplitude and/or in frequency.

Another object of the present invention is to provide a novel semiconductor circuit element that can convert amplitude modulated signals into frequency modulated oscillations with relatively simple apparatus.

Still another object of the present invention is to provide a novel semiconductor circuit element that can produce high frequency oscillations which are tunable without the need of an external capacitor and/or an inductor.

Briefly stated, the novel circuit element comprises a body of semiconductor material having contiguous N type and P type regions with a PN junction between them. The P region is provided with an ohmic contact and the N region with a pair of spaced ohmic contacts. The N type region has a bulk negative resistance characteristic and exhibits oscillations over a range of predetermined values of applied voltage. The frequency of these oscillations can be controlled by a control voltage applied between the ohmic contact on the P type region and one of the ohmic contacts on the N type regions, the frequency of the oscillations being a function of the amplitude of the control voltage. The amplitude of the oscillations can be controlled by the amplitude of the voltage applied between the two ohmic contacts on the N type region.

A material is said to have a bulk negative resistance when its resistance decreases over a range of voltages applied across the material to cause current to flow through it.

The improved semiconductor circuit element and apparatus for operating it as a high frequency oscillator will be described in detail with reference to the accompanying drawings, in which.

Figure 3:
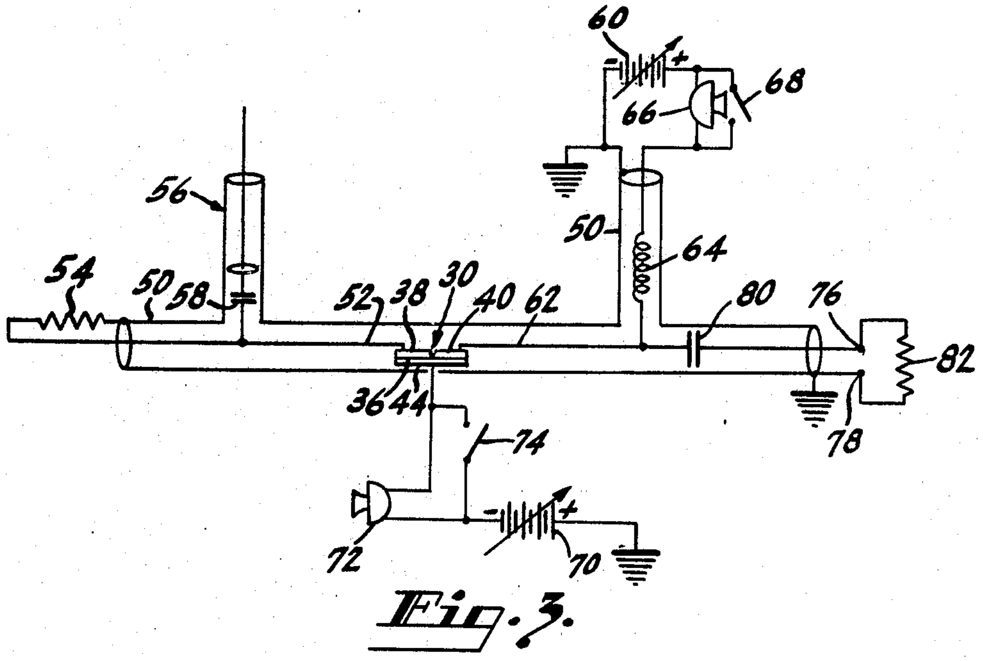
Figure 4:
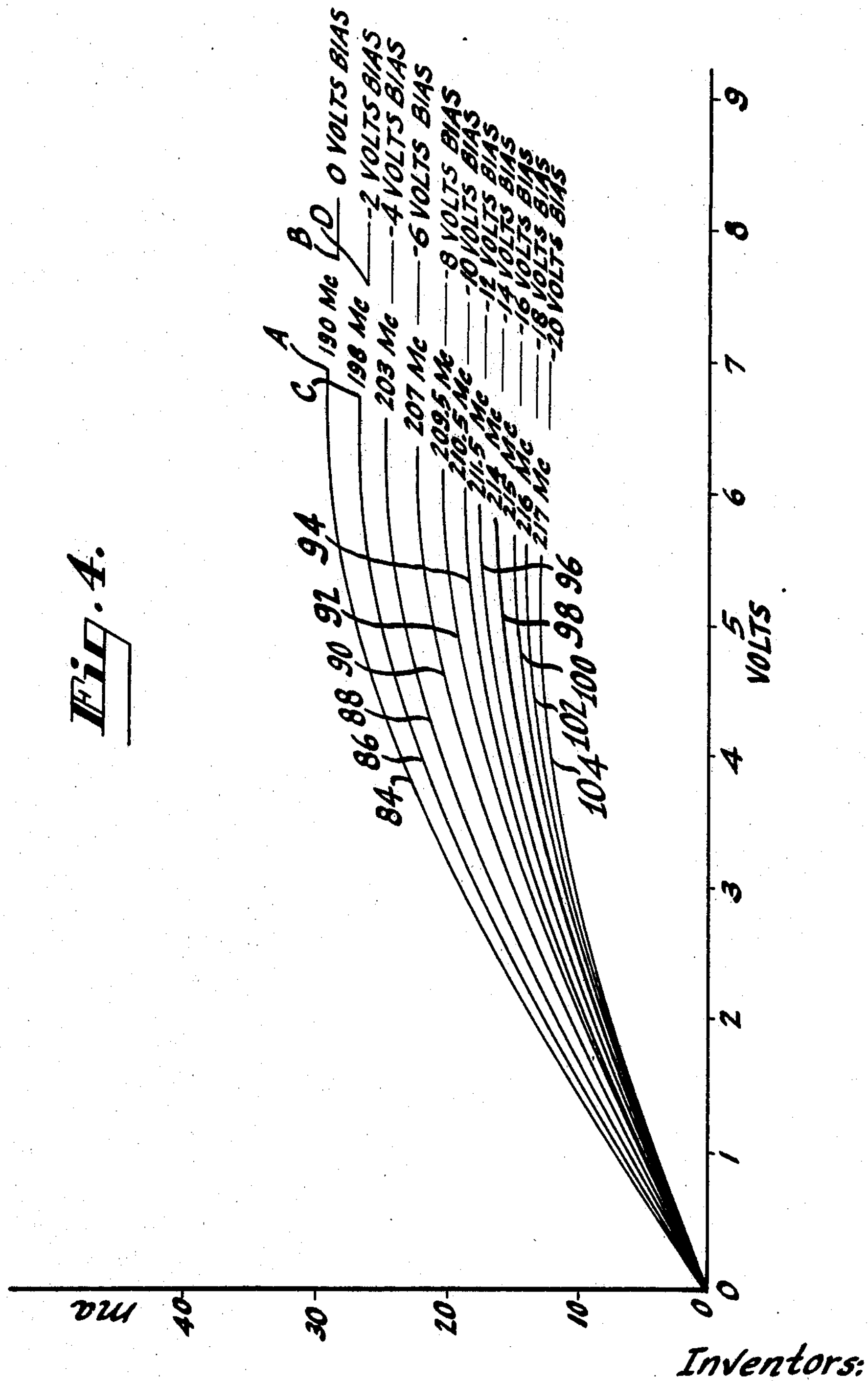
Figure 5:
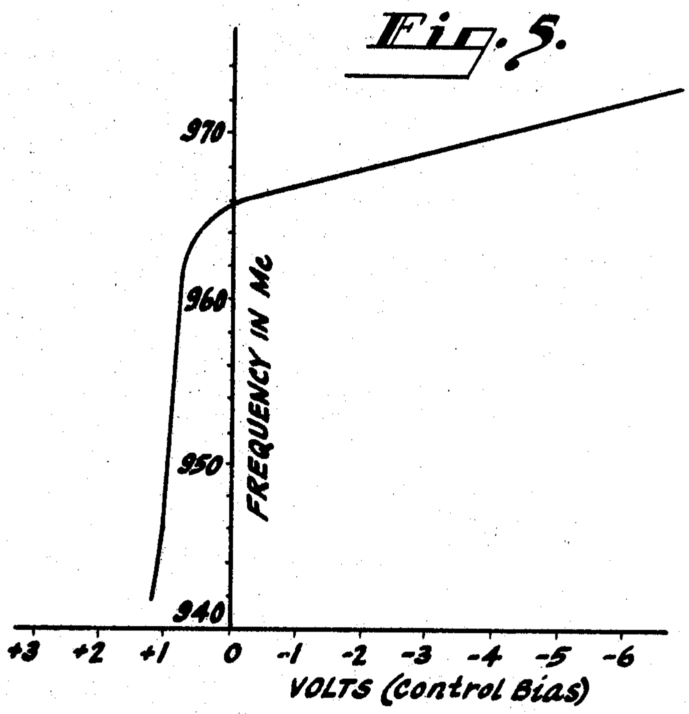
Figure 6:
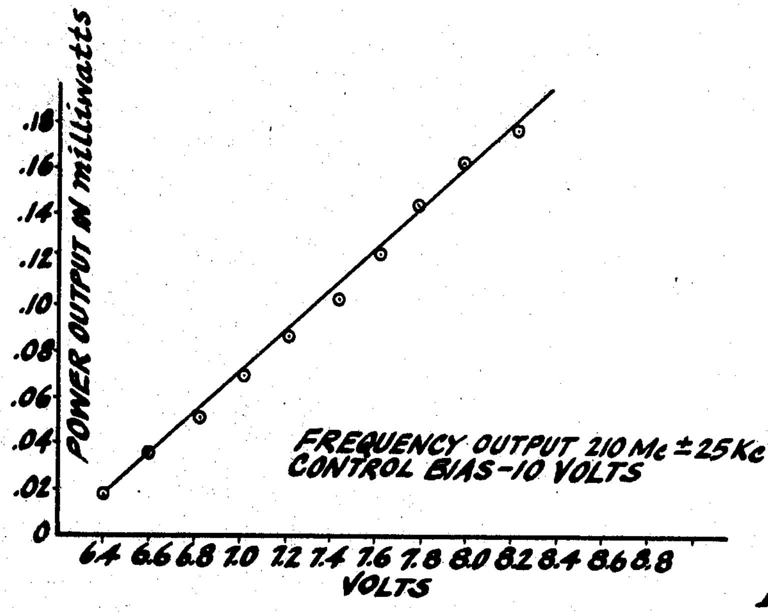

FIG. 3 is a schematiic diagram of apparatus, utilizing the novel circuit element, for both amplitude modulating and frequency modulating high frequency oscillations, FIG. 4 is a series of curves illustrating the voltage-ampere characteristics of the N type region of the novel circuit element under different control (bias) voltage conditions, FIG. 5 is a plot of the frequency of the output oscillations of the novel circuit element, in the circuit of FIG. 3, over a range of control (bias) voltages, and FIG. 6 is a graph of the power output of the novel circuit element over a range of voltages applied between a pair of ohmic contacts on the N type region of the circuit element and under conditions of a fixed bias voltage.

Figures 1, 2:
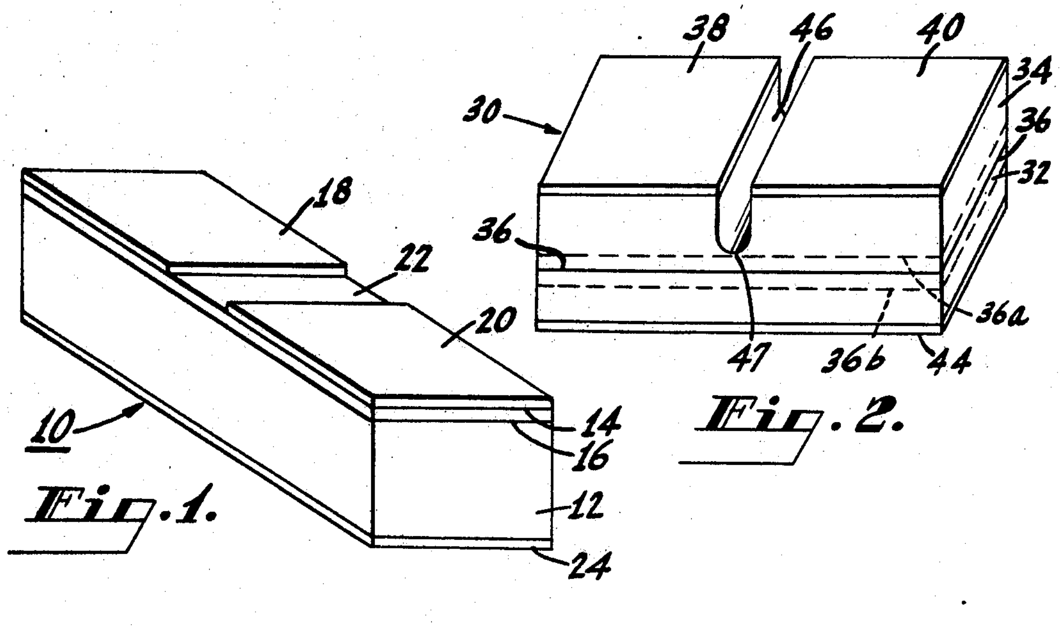
FIG. 1 is one embodiment of the novel circuit element.
FIG. 2 is another embodiment of the novel circuit element.

Referring to FIG. 1 of the drawing, there is shown one embodiment of the novel circuit element 10. The circuit element 10 comprises a body of contiguous P and N type regions 12 and 14, respectively, of a semiconductor material, such as a gallium arsenide (GaAs), gallium arsenide phosphide ($GaAs_{1-x}P_x$), where $1>x>.60$, indium phosphide (InP), indium arsenide (InAs), and cadmium telluride (CdTe). The P and N type regions 12 and 14 form a PN junction 16 between them. The N type semiconductor material should have a voltage-ampere (V-I) charactreistic which exhibits a buck negative resistance and oscillations over a range of predetermined values of applied voltage. The oscillations occur when the electric field is in the neighborhood of about 3600 volts/centimeter for N type gallium arsenide. This V-I characteristic will be explained in detail hereinafter.

A pair of spaced-apart ohmic contacts 18 and 20, such as contacts of tin (Sn), are alloyed onto a major surface 22 of the N-type region 14. The ohmic contacts 18 and 20 should be spaced from each other so that the electrical resistance between them is between about 30 and 400 ohms. An ohmic contact 24, such as of nickel (Ni), is fixed to a major surface of the P type region 12 that is parallel to the PN junction 16, as by electroless plating. The contacts 18, 20, and 24 may be gold (Au) plated to provide means for making solder electrical connections easily thereto.

The dimensions of the circuit element 10 are about 250 microns long, 125 microns wide, and 75 microns thick (distance between electrodes 24 and 20). These dimensions are not critical, the spacing between the contacts 18 and 20, however, should be such that the electrical resistance measured between them is between 30 and 400 ohms. A typical thickness of the N type region 14 for the circuit element 10 is about 3 microns, and the distance between the contacts 18 and 20 is between about 12 and 75 microns for N type GaAs having a charge carrier concentration of between about $10^{14}$ cm.$^{-3}$ and $10^{18}$ cm.$^{-3}$.

It is not always possible to predict the resulting electrical resistance between the contacts 18 and 20 during the manufacture of the circuit element 10. Where an electrical resistance of a particular value, between 30 and 400 ohms, is desired, a modification of the novel circuit element 10, shown in FIG. 2 as element 30 may be made. The circuit element 30 comprises P type and N type regions 32 and 34, respectively, with a PN junction 36 between them. A pair of spaced apart ohmic contacts 38 and 40, such as of tin, are alloyed onto a major surface of the N region 34, and an ohmic contact 44, such as of nickel, is fixed to a major surface of the P type region 32, as by electroless plating.

The N type region 34 may be in the order of 25 microns thick. To provide an electrical resistance of a desired value between the electrodes 38 and 40, a slot 46 is formed in the N type region 34, perpendicular to the PN junction 36, between the electrodes 38 and 40. This may be done, e.g., with a circular tungsten wire saw, while monitoring the electrical resistance between the contacts 38 and 40. Thus, the sawing operation may be stopped when the desired value of electrical resistance is reached. The ohmic contacts 38 and 40 may be alloyed to the N type region 34 originally as a single metallic layer so that the spaced-apart contacts 38 and 40 can be formed when the slot 46 is formed. The base of the slot 46 does not extend to the PN junction 36 and may be spaced between about 1 and 15 microns from the PN junction 36, the over-all dimensions of the circuit element 30 being substantially the same as those of the circuit element 10 shown in FIG. 1. The width of the slot 46 is not critical and may be between about 0.5 and 3 mils. The function of the slot 46 is to concentrate an electric field, when applied between contacts 38 and 40, in a relatively small region 47 between the base of the slot 46 and the PN junction 36.

The novel circuit element 10 or 30 can function as a high frequency oscillator to provide amplitude modulated and/or frequency modulated oscillations when connected in a high frequency circuit of the type shown in FIG. 3. Means are provided to connect a source of variable voltage between the contacts 38 and 40. To this end, the contact 38 of the circuit element 30 is connected to an outer conductor 50 of a coaxial cable through an inner conductor 52 in series with a resistor 54. The resistance of the resistor 54 is smaller than that between the contacts 38 and 40, and serves to sample the current flowing through the circuit element 30. An adjustable shorting stub 56 is connected between the inner and outer conductors 52 and 50 of the coaxial cable through a DC isolation capacitor 58 and functions as tuning means in a manner well known in the high frequency art.

The contact 40 of the circuit element 30 is connected to the positive terminal of a variable voltage source 60, illustrated herein as a battery, through an inner conductor 62 in series with an RF choke 64 and a source of signals of different amplitudes, such as a microphone 66. The microphone 66 can be shorted by a single-pole single-throw switch 68 connected across the microphone 66. The negative terminal of the voltage source 60 is connected to the outer conductor 50 of the coaxial cable. The outer conductor 50 of the coaxial cable is a common connection which may be grounded, as shown. The voltage source 60 is thus connected in series with the contacts 38 and 40 of the circuit element 30.

A control voltage, such as from a variable bias voltage source 70, for example, is connected in series with the contact 44 of the circuit element 30 and the (grounded) outer conductor 50 of the coaxial cable. To this end, the negative terminal of the bias voltage source 70 is connected to the contact 44 through a source of signals of varying amplitude, such as produced by a carbon microphone 72. The positive terminal of the bias voltage source 70 is connected to the common grounded connection, the outer conductor 50 of the coaxial cable. The microphone 72 can be shorted by a single-pole single-throw switch 74 connected across it.

The output from the circuit element 30 is derived between a pair of output terminals 76 and 78. The output terminal 76 is coupled to the contact 40 through a coupling capacitor 80, and the output terminal 78 is connected to the common connection, ground. The output terminals 76 and 78 are connected to a load impedance 82, such as a sampling oscilloscope, a spectrum analyzer, or any other suitable utilization device.

The operation of the circuit element 10 or 30 as a high frequency oscillator and as a generator of frequency modulated and/or amplitude modulated oscillations, in the circuit of FIG. 3, will be described with the aid of graphs in FIGS. 4, 5, and 6. The voltage-ampere characteristic curves 84–104, shown in FIG. 4, of the circuit element 30, for example, are derived as follows: The switches 68 and 74 in the circuit of FIG. 3 are closed. With zero bias voltage on the contact 44, the voltage of the voltage source 60 is increased from zero to about 9 volts. The locus of points whose coordinates are the applied voltages of the voltage source 60, plotted as the abscissas, and the current through the N type region 34 of the circuit element 30, as calculated from the voltage measured across the resistor 54 by a voltmeter (not shown), plotted as the ordinates, is the V-I characteristic curve 84. The curve 84 may be plotted automatically by an automatic X-Y recorder in a manner well known in the art. The curve 84 exhibits a bulk negative resistance at point A on the curve, that is, at the threshold voltage of 6.9 v. Also, at point A, oscillations at a frequency of 190 mc. occur over a range of about 0.8 volt (from 6.9 v. to 7.7 v.). These oscillations can be detected on a sampling oscilloscope if the latter is substituted for the load impedance 82. The oscillations stop at point B on the curve 84.

The V-I characteristic curve 86 is obtained with a bias of −2 volts applied to the contact 44 with respect to the contact 38 and over a range of voltages from 0–9 volts. At point C on the V-I characteristic curve 86, a bulk negative resistance effect is observed, and oscillations of 198 mc. occur between points C and D. The V-I characteristic curves 88–104 are obtained successively, in a similar manner, by increasing the bias voltage in incremental steps of −2 volts (over a range from −4 volts to −20 volts) for each V-I characteristic, as shown in FIG. 4. Each of the V-I characteristic curves 88–104 exhibits a bulk negative resistance effect at which oscillations occur.

From an examination of the V-I characteristics 88–104 shown in FIG. 4, it is apparent that the circuit element 30 can be caused to produce oscillations when the voltage across its contacts 38 and 40 is within a range of predetermined values (greater than a threshold value), and that the frequency of the oscillations is a function of the control voltage between the contacts 38 and 44.

The frequency of oscillations generated by the circuit element 30 over a range of control bias voltages is illustrated in FIG. 5. With zero bias, that is, with zero volts on the P region, oscillations of 966 mc. are produced (with a particular sample of the circuit element 30). As the control voltage is increased in a negative direction, that is, as the back bias on the PN junction 36 is increased, the frequency of oscillations is increased in a substantially linear manner. As the control voltage on the contact 44 with respect to the contact 36 is increased in a positive direction, a substantially nonlinear relatively rapid decrease in the frequency of oscillations is observed. The relatively linear change in frequency with respect to changes in the negative control voltages applied to the contact 44 is believed to be due to the changes in the width of the depletion region (indicated by the dashed lines 36*a* and 36*b* on opposite sides of the PN junction 36, in FIG. 2) and consequently to changes in the PN junction capacitance, resulting from the back biasing of the PN junction 36.

A frequency modulated oscillatory output is produced by the circuit of FIG. 3 by closing the switch 68, opening the switch 74, and adjusting the voltage source 60 until oscillations are produced. With a control voltage of −10 volts, for example, supplied by the voltage source 70 (to one sample of the circuit element 30), oscillations of 210.5 mc. are produced, as shown by the V-I characteristic curve 94. By modulating the amplitude of the control voltage with the microphone 72, as by speech signals into the microphone 72, the frequency of the ouput oscillations can be changed. For example, if the control bias voltage (−10 volts) applied to the contact 44 of the control element 30 is varied ±2 volts, the output frequency of the oscillations will vary between 209.5 mc. and 211.5 mc., as illustrated by V-I characteristic curves 92 and 96 (FIG. 4), respectively.

Amplitude modulated oscillations can be provided at the output of the circuit shown in FIG. 3 by closing the switch 74 and opening the switch 68. With a constant control (bias) voltage applied to the contact 44, say −10 volts, provided by the voltage source 70, oscillations of 210.5 mc. are produced by adjusting the voltage source 60 to a value between the threshold voltage 6.2 volts and 7.2 volts. By varying the amplitude of the voltage within this range of voltages, as by audio signals applied to the microphone 66, the amplitude of the output oscillations are also caused to vary. This is illustrated by the graph in FIG. 6 which shows a substantially direct relationship of the power output of the oscillations in milliwatts over a range of voltages applied between the pair of ohmic contacts 38 and 40 on the N type region 34 of a sample of the circuit element 30.

What is claimed is:

1. A semiconductor circuit element comprising a body of contiguous N type and P type regions having a PN junction therebetween, a pair of spaced ohmic contacts on said N type region for applying a voltage thereacross, said N type region being of a material having a bulk negative resistance and exhibiting oscillations over a range of predetermined values of said applied voltage, and a third ohmic contact on said P type region, said third ohmic contact and one contact of said pair of contacts comprising means to apply a control voltage therebetween, the other contact of said pair of ohmic contacts comprising means to derive said oscillations therefrom, the frequency of said oscillations being a function of the amplitude of said control voltage.

2. A semiconductor circuit element as described in claim 1 wherein said N type and P type regions comprise a semiconductor material chosen from the group consisting of GaAs, InP, InAs, CdTe, and $GaAs_{1-x}P_x$, where $x$ is less than 1 and greater than 0.60, and said semiconductor material has a charge carrier concentration between about $10^{14}$ cm.$^{-3}$ and $10^{18}$ cm.$^{-3}$.

3. A semiconductor circuit element as described in claim 1 wherein the resistance between said pair of spaced ohmic contacts is between about 30 and 400 ohms, and the amplitude of said oscillations is a function of said voltage between said pair of ohmic contacts on said N type region.

4. A semiconductor circuit element as described in claim 1 wherein a groove is formed in said N type region between said pair of spaced ohmic contacts, the bottom of said groove is spaced from said PN junction, and the resistance between said pair of spaced ohmic contacts is between 30 and 400 ohms.

5. In combination, a semiconductor circuit element comprising a body of N type and P type regions and a PN junction therebetween, a pair of spaced ohmic contacts on said N type region, means for applying a voltage between said pair of ohmic contacts, said N type region having a bulk negative resistance and exhibiting oscillations over a range of predetermined values of said applied voltage, a third ohmic contact on said P type region spaced from said PN junction, means applying a control voltage between said third ohmic contact and one contact of said pair of ohmic contacts, and means coupled to said other contact of said ohmic contacts to derive said oscillations therefrom, the frequency of said oscillations being a function of the amplitude of said control voltage.

6. The combination defined in claim 5 wherein said circuit element comprises gallium arsenide and said N type region has a donor concentration of between about $10^{14}$ cm.$^{-3}$ and $10^{18}$ cm.$^{-3}$.

7. The combination defined in claim 6 wherein said means for applying a control voltage comprise means to vary the voltage across said PN junction, whereby to modulate the frequency of said oscillations, the amplitude of said oscillations being a function of the amplitude of said voltage applied between said pair of ohmic contacts.

8. The combination as defined in claim 5 wherein said means for applying a voltage between said pair of ohmic contacts comprises means to vary the amplitude of said last-mentioned voltage, whereby to vary the amplitude of said oscillations.

9. A circuit element comprising a body of N type semiconductor material chosen from the group consisting of GaAs, InP, InAs, CdTe, and $GaAs_{1-x}P_x$ where $1>x>0.6$, said body having a charge carrier concentration between about $10^{14}$ cm.$^{-3}$ and $10^{18}$ cm.$^{-3}$, a pair of spaced ohmic contacts on said body for applying a voltage thereacross, said body being of a material having a bulk negative resistance and oscillations over a range of predetermined values of said applied voltage, the resistance between said contacts being between about 30 and 400 ohms, a P-type layer on said body, and a third contact on said P-type layer, said third contact and one contact of said pair of contacts comprising means to apply a control voltage therebetween, the other contact of said pair of contacts comprising means to derive said oscillations therefrom, the frequency of said oscillations being a function of the amplitude of said control voltage, and the amplitude of said oscillations being a function of the amplitude of the voltage applied between said pair of contacts.

References Cited

UNITED STATES PATENTS

| | | | |
|---|---|---|---|
| 3,243,732 | 3/1966 | Schnitzler. | |
| 3,270,258 | 8/1966 | Gault | 307—304 X |
| 3,281,699 | 10/1966 | Harwood | 307—304 X |
| 3,365,583 | 1/1968 | Gunn. | |

ALFRED L. BRODY, Primary Examiner

U.S. Cl. X.R.

307—251, 283, 304; 317—235; 331—107; 332—16